(12) United States Patent
Leigh (10) Patent No.: US 12,199,205 B2
(45) Date of Patent: Jan. 14, 2025

(54) POWER DISTRIBUTION AND CELL STORAGE APPARATUS

(71) Applicant: GRAFMARINE LIMITED, Ashley (GB)

(72) Inventor: Martin Leigh, Altrincham (GB)

(73) Assignee: GRAFMARINE LIMITED, Ashley (GB)

( * ) Notice: Subject to any disclaimer, the term of this patent is extended or adjusted under 35 U.S.C. 154(b) by 0 days.

(21) Appl. No.: 16/621,920

(22) PCT Filed: Jun. 15, 2018

(86) PCT No.: PCT/GB2018/051673
§ 371 (c)(1),
(2) Date: Dec. 12, 2019

(87) PCT Pub. No.: WO2018/229510
PCT Pub. Date: Dec. 20, 2018

(65) Prior Publication Data
US 2020/0119211 A1 Apr. 16, 2020

(30) Foreign Application Priority Data

Jun. 15, 2017 (GB) .................................... 1709562

(51) Int. Cl.
*H01L 31/042* (2014.01)
*H01L 31/12* (2006.01)
(Continued)

(52) U.S. Cl.
CPC ............ *H01L 31/042* (2013.01); *H01L 31/12* (2013.01); *H02S 20/30* (2014.12); *H02S 40/36* (2014.12); *G05F 1/66* (2013.01)

(58) Field of Classification Search
CPC ..... H01L 31/042; H01L 31/12; H01L 31/048; H01L 33/00; H02S 20/30; H02S 40/36;
(Continued)

(56) References Cited

U.S. PATENT DOCUMENTS

D712,822 S 9/2014 Brusaw et al.
8,907,202 B1 12/2014 Brusaw et al.
(Continued)

FOREIGN PATENT DOCUMENTS

DE 102010028180 A1 10/2011
EP 2395555 A2 12/2011
(Continued)

OTHER PUBLICATIONS

Steve Albrecht "Monolithic perovskite/silicon-heterojunction tandem solar cells processed at low temperature" Energy Environ. Sci., 2016, 9, 81 (Year: 2016).*
(Continued)

*Primary Examiner* — Michael Y Sun
(74) *Attorney, Agent, or Firm* — Notaro, Michalos & Zaccaria P.C.

(57) ABSTRACT

An apparatus and method for the localized capture, storage and specialized use of power generated from natural sources, such as solar power or hydropower. The apparatus can be used, for example, on a deck or a side of a marine vessel, or on a land-based structure, where there is a requirement for power generation and storage.

24 Claims, 4 Drawing Sheets

(51) Int. Cl.
*H02S 20/30* (2014.01)
*H02S 40/36* (2014.01)
*G05F 1/66* (2006.01)

(58) Field of Classification Search
CPC . H02S 20/10; H02S 20/00; G05F 1/66; Y02E 10/50; Y02E 70/30; H10K 30/88
See application file for complete search history.

(56) References Cited

U.S. PATENT DOCUMENTS

| | | | |
|---|---|---|---|
| 10,501,864 B2 | 12/2019 | Sung et al. | |
| 2001/0037825 A1* | 11/2001 | Nakano | H01L 31/056 136/256 |
| 2009/0268446 A1 | 10/2009 | Lai et al. | |
| 2009/0314330 A1* | 12/2009 | Saha | H01L 31/0504 136/246 |
| 2010/0043319 A1* | 2/2010 | Bennett | E04D 1/29 52/173.3 |
| 2010/0096003 A1* | 4/2010 | Hobbie | H01L 31/049 136/254 |
| 2011/0290296 A1* | 12/2011 | Daniel | H02S 40/38 136/244 |
| 2012/0103392 A1* | 5/2012 | Daniel | H01L 31/0543 136/246 |
| 2012/0132253 A1* | 5/2012 | Shimizu | H01L 31/0465 136/244 |
| 2013/0153934 A1* | 6/2013 | Meitl | G09F 9/35 257/84 |
| 2013/0186466 A1* | 7/2013 | Hebrink | C12N 15/113 428/149 |
| 2013/0236697 A1* | 9/2013 | Walker, Jr. | G02B 1/118 83/13 |
| 2014/0026945 A1* | 1/2014 | Correia | H02S 40/44 29/890.033 |
| 2014/0230883 A1* | 8/2014 | Iwasaki | H05K 1/189 136/246 |
| 2015/0068584 A1* | 3/2015 | Sweatt | G02B 3/0068 136/246 |
| 2015/0287863 A1* | 10/2015 | Lim | G02F 1/0147 136/252 |
| 2016/0035496 A1 | 2/2016 | Irwin et al. | |
| 2017/0149376 A1 | 5/2017 | Huang et al. | |

FOREIGN PATENT DOCUMENTS

| | | |
|---|---|---|
| EP | 3163629 A1 | 5/2017 |
| KR | 101295625 B1 | 8/2013 |
| KR | 101415168 B1 | 7/2014 |
| KR | 101729084 B1 | 5/2017 |

OTHER PUBLICATIONS

Dana Varinsky: "Snow-melting solar roads are being tested publicly for the first time in the US", Business Insider Nederland, Oct. 5, 2016 (Oct 5, 2016), XP009507920, Retrieved from the Internet: URL:https://www.businessinsider.nl/solar-road-panels-first-public-test-2016-10/?international=true&r= US, retrieved Dec. 11, 2019.
International Search Report and Written Opinion for corresponding PCT application No. PCT/GB2018/051673, mailed Sep. 18, 2018.
Korean Office Action for Korean Application No. 10-2020-7001205 dated Jan. 31, 2023 with translated Office Action Summary.
Extended European Search Report for corresponding EP application No. 22173977.4, dated Nov. 14, 2024.

* cited by examiner

POWER DISTRIBUTION AND CELL STORAGE APPARATUS

The present invention relates to an apparatus for the generation, storage and management of power, which derives its energy from natural sources, such as solar power or hydropower. The apparatus can be used, for example, integrated into a deck structure or as part of pre-manufactured side of a marine vessel, or on a land-based structure, where there is a requirement for localized power generation, localized storage and wider distribution of power, and energy management within the layout of, or beyond, an area containing the apparatus or a structural area.

BACKGROUND OF THE INVENTION

Existing power capture and storage apparatuses, such as solar panels, that are currently in use, particularly in environments such as marine environments, are adapted from solid structure systems, such as those which contain glass, which are rigid and unsuitable for use on contoured or flexing structures.

However, not all surfaces have structures that are fixed and rigid. Some surfaces, for example those on boats and ships when in the water, are in a constant state of motion and are constantly moving and flexing with the movement of the water underneath them. Existing rigid power capture and storage apparatuses are not suitable for such surfaces. The surfaces on boats and ships are exposed extensively to solar energy and hydropower, and are therefore a potentially significant source of harvestable energy, if this power can be harnessed.

Therefore, in accordance with the invention, there is provided an apparatus for the capture and storage of power, the apparatus comprising:
  i) a first layer acting as a protective layer;
  ii) a second layer comprising a device that is able to generate power from a natural energy source, wherein the first layer simultaneously allows the second layer to be exposed to the natural energy source; and
  iii) a third layer comprising an energy distribution system.

The first layer constitutes a protective layer for the second layer, while simultaneously allowing the second layer to be exposed to the natural energy source for the power that is to be generated by the second layer. The first layer must therefore comprise a material that is able to allow this. For example, in the case of solar energy, it needs to be pervious to solar energy. In some embodiments, the first layer is visually transparent, and/or pervious to solar radiation. The first layer may comprise, or be formed from, materials such as a resin, fiberglass, toughened glass, or a hardened polymer, such as a silicon-based polymer, or poly(methyl methacrylate), marketed under the trade names Plexiglas® or Perspex®. It may also be any mixture of materials that imparts multi-purpose enhancement, such as those which are able to provide characteristics such as non-slip and durability.

The first layer is also typically the layer which is uppermost in the apparatus of the invention, and which will be exposed most to the elements and human contact. It is also the layer which will be walked upon, and therefore needs to be sufficiently sturdy to be walked upon without fracturing and breaking, while also being relatively lightweight, durable, and resistant to scratching and extreme temperature conditions, and also substantially slip-resistant. Therefore, according to another embodiment, the first layer is provided with non-slip characteristics, in order that people walking thereon do not slip and fall. Examples of such non-slip characteristics include, but are not limited to, raised protrusions, optionally in the form of patterns, which can be random or repeated, which can permit a larger coefficient of friction and thus grip, or pieces of a particulate material embedded in the layer, which provide a rougher surface, and therefore also a larger coefficient of friction.

In operation, the second layer is positioned underneath the first layer. Optionally, if desired, there may be an air gap between the first and second layers.

The second layer may be any device that is able to generate power from exposure to its environment. For example, such devices include, but are not limited to, a solar panel, or a hydrogen fuel cell that can generate power from water. This will also include the use of solar energy in the form of a tile that may create and store the energy within the second layer and allow this to become a linked storage device as well as a harvester of energy.

When the apparatus of the invention is generating power from solar energy, the second layer typically comprises a plurality of photovoltaic (PV) cells which are fixed to an upper surface of the second layer. By the upper surface of the second layer is meant the surface which is proximal to the first layer. These PV cells may be arranged in any pattern or formation as desired, and may be made into bespoke PV shape(s) which are linked together as a circuit to pass created energy through one side of one PV cell to the next. Any bespoke patterns are contained within the light responding areas of the second layer, with the final PV design being dependent on the size of the tile and the type of PV cell used for that particular requirement.

The PV cells may be flat ink jet-printed or screen-printed, or they may be 3D printed. They may comprise a plastic foil base or similar, and, for example, employ the use of perovskite crystallization. They may also include the use of graphene nano-tubes used as part of a PV cell structure, produced either on a copper layer or as part of a sandwich of materials to harvest solar energy.

According to one embodiment, the PV cells are arranged in rows on the upper surface of the second layer. These rows may be substantially parallel. In one embodiment, the upper surface of the second layer may be divided into a plurality of sections, such as two, three, four, or more, with a plurality of PV cells being positioned within each section in any arrangement desired, such as in a series of parallel rows.

Alternatively, or in addition, there may be a plurality of PV cells located on one or more sides of the second layer. They may be bonded onto the sides of the second layer by any suitable means, such as by adhesive or suitable PV stable conductive backing material. The PV cells may be coated with a conductive material, such as but not limited to, a graphene oxide paste, and any collected energy will flow around the edges of the PV cell array designed within the PV cell layout, with the ability to bypass any of the individual PV cells should they become inoperable or be damaged beyond normal use, being avoided through the design of the PV wiring.

According to another embodiment, the plurality of sections may each be separated by a spacing between them on the upper surface of the second layer, the spacing containing no PV cells. In one or more of these spaces, one or more light emitting diodes (LEDs) may be positioned along the spaces. These LEDs can provide lighting which is independent of the power supply of the structure or vessel upon which the apparatus is located, the intensity of which can be controlled depending upon the desired use. The LEDs are able to provide lighting when daylight is not sufficient to be adding energy to the apparatus by use of the PV cells. The light emitted will create an ambient and diffused light effect as it will be diffused by the protective first layer, and the lighting may only be activated when the apparatus is not generating energy. However, in the event of a power loss or in an emergency situation, the LEDs can be activated, when a management system for the apparatus, controlled by a printed circuit board (described further hereinbelow) can override the harvesting of solar energy and provide energy to the LEDs.

The use of a light guide may be employed to reduce reflective loss. The use of a light guide or optic concentrator device, such as a luminescent solar concentrator (LSC), is also for concentrating radiation, solar radiation in particular, to produce electricity. The PV cell arrangement on the second layer may be covered with a thin mini or micro Fresnell or bespoke light concentrator lens or, may be used without any lens attachments. The dual use of a reflective lens is also for the dispersion of light created by the LED integrated within the PV cell layer.

The second layer is a three-dimensional structure comprising vertical sides having a thickness which is typically between about 5 mm and about 20 mm. The optic arrangement is inserted between a lower and upper housing which is sealed on fabrication. For example, in an embodiment where the second layer has a hexagonal shape, the PV cells may be present on all six vertical sides of the hexagon, or alternatively, may be present on three adjacent vertical sides, with the other three adjacent sides instead having a reflective or mirrored surface thereon. Of course, it will be appreciated that the second layer—and other layers in the apparatus by extension—may have the hexagonal shape, or may have any other desired shape, geometrical or non-geometrical.

According to one embodiment, the PV cells are only located on the upper surface of the second layer, in a substantially flat arrangement across the surface, without any mounted on the sides.

According to one embodiment, the second layer may also comprise a reflective material on the upper surface of the second layer, which may be in the form of a bespoke arrangement of PV cells, or a reflective material, such as but not limited to, aluminium sheeting with high reflective finish. Other metals or materials with high levels of light reflectance could also be used as the reflective base. This reflective base aids in the capture of the solar energy, by reflecting light back upwards so that it may be captured by the PV cells.

The second layer may also comprise dyes and quantum dots embedded within the layer structure. These enable light spectrum enhancement and harvesting for the increased capture of solar energy.

The solar or light energy, after travelling through the first layer, becomes trapped within the second layer, and is directed towards the PV cells on the base or sides of the second layer. The presence of the quantum dots enables the scattering of the light energy to the PV cells, thus maximizing the light energy captured by the apparatus. Additionally, the dyes present in the second layer absorb the light energy at one wavelength, and then emits the light at a slightly longer wavelength, which results in slightly more power being generated as a result of the longer wavelength light.

The floor of the second layer may also be reflective at varying strengths in order to optimize energy harvesting. This will be determined by the diameters of the apparatus and the energy generation capacity of that particular apparatus.

Another typical arrangement is for the use of an inserted bespoke produced PV arrangement PV cell arrangement, which is mounted and joined together in series that maximizes the area within the optical tile design to provide the best possible use of energy harvesting within the apparatus design to harvest light.

Another arrangement envisaged within the invention includes the passive use of solar harvested energy together with a hydrogen converting membrane that would convert sea water that had been purified into hydrogen and oxygen for storage.

The third layer of the apparatus typically comprises three sub-layers, which comprise one sub-layer which is highly conductive and enables the transfer of power between each individual apparatus to form an energy grid structure. This sub-layer acts as an energy distribution layer. This conductive sub-layer may comprise any highly conductive material, such as a composite alloy or a highly conductive mesh structure. The metal composite(s) may be made of known powdered metals, such rare earth magnetic metals, copper, copper oxide, graphene, cobalt and nickel metals, where many of the occurring impurities are removed and oxides are reduced from the metals through advanced production techniques. These may then be combined into a weave and coated in a nano-rubberised and weather resistant material (s), to form a flexible (or non-rigid) conductive mesh structure. The main metals can be additive manufactured (AM) to encase the main conductive metal layer, and then powder coated with a conductive material such as graphene, to provide the maximum resistance to the harsh environment the apparatus will operate in. By way of non-limiting example, the conductive sub-layer may comprise a composite alloy weave, which is encased or coated by a mixture of a polymer (such as rubber) and graphene.

This conductive sub-layer can be produced in a small or large sheet form to be anchored centrally within each third layer of the apparatus to provide flexibility and movement tolerance, while still being able to provide consistent levels of conductivity across the energy distribution layers of a plurality of apparatuses.

The composite alloy may be created with a high concentration of metal-based materials mixed as nano-sized powders and then printed effectively maintaining their properties at molecular level, at any size or shape, retaining the composite qualities at each size. These molecular composites may contain a high level of magnetism, and can facilitate high efficient electrical transmission by magnetism or electromagnetism to facilitate the flow of electrical power.

The conductive sub-layer is typically positioned, or sandwiched, between two sub-layers (upper and lower) of an electrically and thermally non-conductive (or minimally conductive) material. This non-conductive material may be, or comprise, any suitable lightweight non-conductive material, such as for example, a resin composite material.

This conductive sub-layer may also have one or more sensors located thereon, in order to be able to continually or periodically monitor the conductivity of the conductive sub-layer over time for any variation. The sensors may be connected to software and/or hardware, which may include, for example but not exclusively, a laptop computer or smart phone, from which the relevant information can be accessed.

The one or more sensors may be directly connected to the surface or deck to which the apparatus is fixed, via an opening in the lower sub-layer of the third layer which is positioned directly below the one or more sensors on the conductive sub-layer.

In another embodiment of the invention, the apparatus may be contained within a housing. Alternatively, only the first and/or second layers may be contained within the housing. The apparatus and/or housing typically possesses robust thermal properties, provided by the inclusion of a fire-retardant material within the apparatus and/or housing. The housing may comprise a resin material containing the fire-retardant material, and facilitates the release of heat out of the apparatus in order to prevent the apparatus from overheating, and reducing any fire risk. The apparatuses may also be also housed within nylon foam inserts for impact and fire-resistant protection.

According to one embodiment of the present invention, there is envisaged an apparatus where the first, second and third layers are all present as part of individual pieces or tiles, which are removable, and which are able to lie substantially flat against a surface to which it is to be attached. Typically, a plurality or array of two or more tiles, to any number above that capable of providing the pre-designed energy requirement, is employed together in the generation, storage and distribution of power, with the third layer providing larger amounts of stored energy distribution system to distribute the electricity across the array. The conductive sub-layer in the third layer helps, in part, to provide the desired flexibility for the apparatus.

The second and third layers may be connected together by any suitable means to securely connect them However, in one embodiment, magnets may be employed. A magnet may be located on the base of the second layer (i.e. underneath the second layer, on its underside), and on an upper surface of the third layer (on the upper sub-layer).

According to another embodiment of the present invention, there is envisaged an apparatus where the first and second layers of the apparatus together form a tile or panel, which is then connected to the third layer. In this embodiment, the third layer typically comprises a plurality of segments of the lower sub-layer and upper sub-layer sandwiching a sheet of the conductive sub-layer. The sheet of the conductive sub-layer is larger than any individual segment of the lower sub-layers and upper sub-layers, and extends between a plurality of the segments. The sheet of the conductive sub-layer may be as large as desired, and extends between as many of the segments as desired. In this embodiment, individual second layers may be positioned on top of the segments of the upper sub-layer. This may be in a way such that each individual second layer lies exactly over each individual upper sub-layer; or alternatively, such that each individual second layer lies in an offset position relative to each individual upper sub-layer, and lies over more than one of the individual upper sub-layers.

In this embodiment, the individual second layers positioned in an offset position relative to each individual upper sub-layer may be connected to each other by means of magnets, where the one or more magnets on the underside of the second layer is located directly above the magnets on the upper surface of the third layer.

Figure 2:
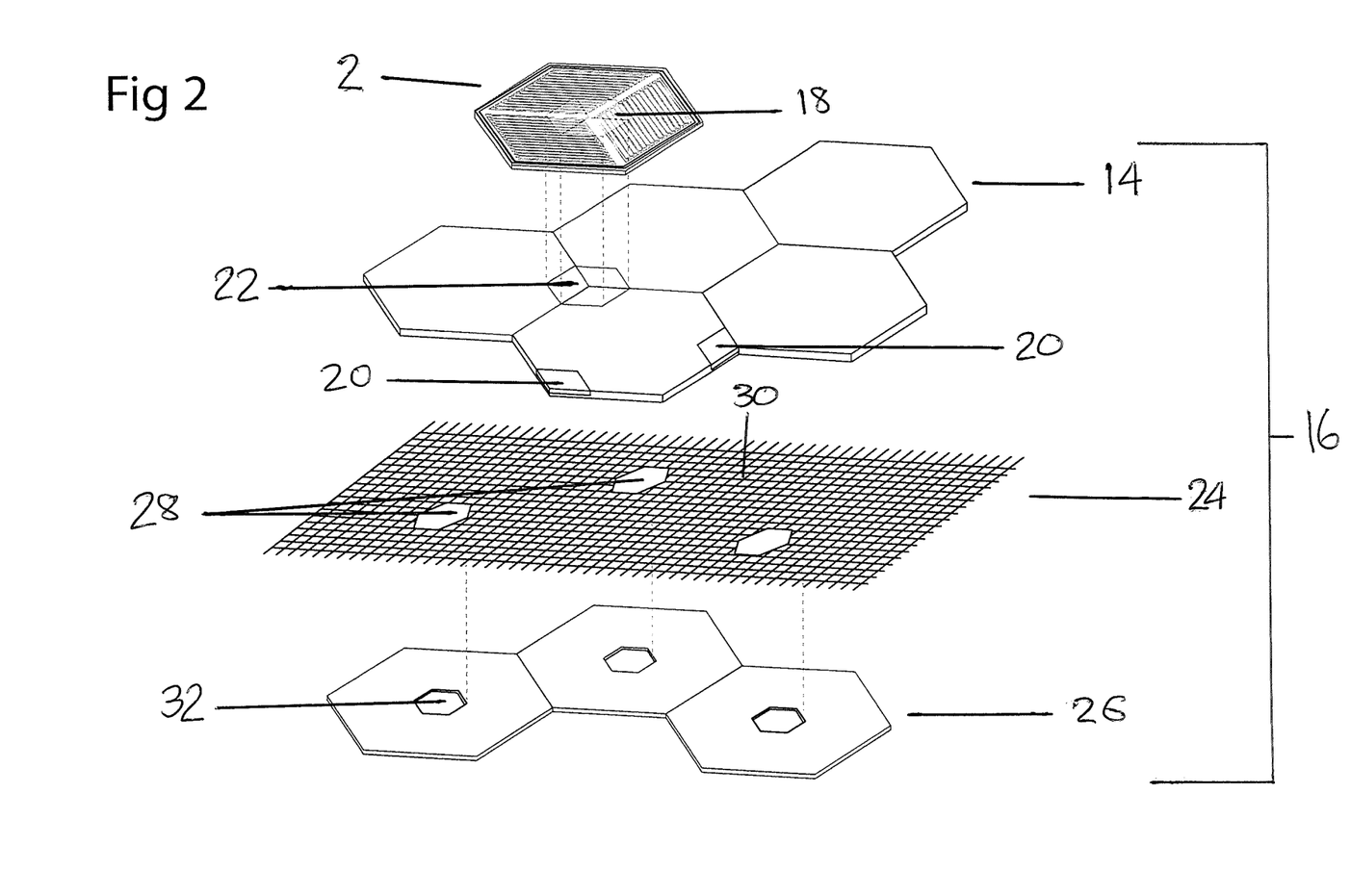
FIG. 2 depicts an exploded vertical view of a plurality of an interconnection of the second layer of the apparatus of the invention with the separate sub-layers of the third layer, and how they fit together vertically.

An example representation of such a magnet arrangement is depicted in FIG. 2 below. For example, there may be one or more magnets positioned centrally on the underside/lower surface of the second layer (i.e. the surface proximal to the third layer), and a plurality of magnets being located at different locations on the upper surface of the third layer. The magnets on the third layer may be located at an edge or corner of the upper surface of the upper sub-layer of the third layer, such that when the second layer is positioned offset over the third layer, the magnet on the underside of the second layer is located directly above the magnets on the upper surface of the third layer. In one embodiment, when a plurality of individual third layers are brought together next to each other, such that the edges or corners of the upper surface of the third layer having the magnets thereon are adjacent each other, these magnets together form a shape or arrangement which corresponds to the shape or arrangement of the magnets on the underside of the second layer.

The apparatus of the invention may be of any shape or dimension desired, to fit in with the area it is located within, or for simple aesthetics. There will be half shapes that will have facet shaped tiles to be used at the edges of arrays to make the transition of a ship's deck system smooth with the lower deck structure to avoid trip hazards or uneven siting of the deck space, where there may be other deck furniture such as hatches. Surrounding deck areas that provide suitable run-off of any deck water or prevent water ingress will remain faithful in height level where there may be the risk of creating standing water or pools of water where the deck is uneven or there is an issue with height restriction. The apparatus is typically of a recognised geometric shape, such as a hexagon, square or rectangle, which allow for the greatest degree of interconnection and surface coverage using the apparatuses; however, it may also be in an irregular, non-geometric, shape which still allows for an effective coverage of the surface the apparatus is to be attached to. These tiles may also be manufactured in clusters for integrated attachment directly onto a vessel.

The electrical energy collected by each apparatus is transferred to an adjacent tile containing a battery in sequence and collects power cumulatively until it reaches an energy management cell. As used herein, the term 'energy management cell' means a cell which controls the flow of electricity across an array of apparatuses according to the invention. These energy management cells provide the management of energy between the energy creation layer—the second layer—and the energy use and distribution layer—the third layer—underneath. These management cells are separated thermally and housed in sealed units to manage the energy as it is moved to where is it is locally required, either on deck or integrating into existing electrical systems within a vessel.

At this same level there will be a series of individual battery cells that are also the same shape as the apparatus of the invention (such as hexagonal), but will have a solid top of resin material, not an optic solar cell. These battery cells will typically be interconnected with other battery cells and work in groups. They will store the energy harvested and may involve the use of additional electronics to manage the battery array(s) in the event of overheating, e.g. thermal runaway.

It has been calculated that it requires a set ratio of apparatuses of the invention in order to charge one battery. Therefore, each battery cell is typically positioned adjacent to up to between two and four apparatuses. This way, groups in arrays are able to provide specific measured power to any individual battery output and design. The energy management system provides the ability to manage all the power collected and evenly distribute this power across the linked batteries, minimizing peaks and troughs in energy creation and use on the system.

The battery can be a standard cell phone sized battery or, it can be a larger battery in size and output, using variable but individual specified lithium ion, lithium sulphur, zinc oxide or any other advanced battery which is available through mass production. It can also vary in shape and depth to accommodate the varying shape of the apparatus (e.g. hexagonal) and depth; and may employ a liquid electrolyte.

Further enhancement of the system may include the development and structural integration of a centralized flow battery system. These battery-containing apparatuses will be self-contained and fit to meet the required size of the battery supplied, lined with fire retardant such as, but not exclusively nylon-based foam materials as well as insulation materials, that make each thermally insulated. The apparatus of the invention is able to charge these batteries using the generated electrical energy The energy management cell typically comprises a printed circuit board (PCB), which manages and directs any harvested energy into a locally connected and separate battery tile and allows the sensing and management of this energy to be reported to a centralised or specialized control unit, which can either accessed through a smart phone app, or can be used with inbuilt navigation panels within an existing ship structure, such as on the instrument panel via a liquid crystal display (LCD) screen. The sensors on the PCB will record and regulate the level of power within battery clusters, they will measure available power and provide information of how long this power can be used at its current discharge rate. There will be a minimum of two recharges for the battery cells per 24-hour cycle. The power generated will be spread across the connected battery clusters to provide even charging.

The energy management cell's PCB also acts as a gateway for the collection of the harvested energy within each battery cell cluster, allowing current stabilization and thermal management across the deck, it also controls the flow of energy to be spread across the deck to be used as where and when required. It also provides a safety break point for the detection of irregular temperature occurrences at a very local level before it causes a problem. The management cell also contains the emergency gateway shut off point for any part's failure, overheating, or over-charging of the battery, and this is controlled through the PCB.

The energy management cells are also typically lined with a fire-retardant material such as, but not exclusively nylon-based foam materials as well as insulation materials, that make each of them thermally insulated.

Both the battery cells and management cells sit directly over the grid system of active layer cells but are insulated with the housing material from the energy generated and held above them to stop any shorting out and damage to components.

The tiles may extend over an entire length of a ship's deck, or any other structure, connected and configured together to maximize the energy creation capability either for the collection of electrical current or on tap power for required use. They can operate as clusters for cluster energy creation or individual energy storage from a minimum of four solar cells. Underneath all of the tiles will be the energy deck connected system, they will be used as a secondary layer only when there is an energy generation system on the surface, or other covering parts to provide the source of power.

In one embodiment, the apparatus is contained within a housing. The housing may comprise a resin material. Alternatively, the housing may comprise a sponge structure having magnetic and heat sink properties. The integrated properties of the housing are designed with the operating environment in mind. For example, where there is a potential build-up of heat, the thermal qualities of the resin can be mixed to be adaptable to this environment.

Each individual part of the housing can be made with bespoke qualities, as desired. For example, any desired additive material—such as a fire-retardant material, or a material for thermal conductivity and heat dissipation, such as graphite—may (or may not, as desired) be contained within a lid over the battery cell, and/or within a lid over the energy management cell; and/or in any other part of the housing. This allows there to be variation in the thermal conductive qualities, depending upon a desired function, as well as whatever operating environment the apparatus, with the battery cells and energy management cells, needs to function within.

When adjacent apparatuses are connected together by magnets, the magnets may be located within a wall of the housing. If desired, there may also be a hard connection using more established materials—depending on the environment this system will operate.

Any space between individual apparatuses may be filled with a latticework of composite materials, that include but are not limited to graphene oxide and aluminum, which may be contained in a rubberized material, which will provide cushioning and reduce friction by having a flexible sponge like quality that allows for some movement and impact. This open space can also act as a heat sink allowing release of heat.

The apparatus may be attached to a surface by any suitable means, which will depend upon the nature and material of any given surface. Suitable means may include, but are not limited to, natural or advanced adhesives, or depending on superstructure, bolts or screws. All tiles are water proofed by the use of composites and resin materials, and these materials have certified and variable good thermal and low conductive qualities.

The supporting structure is flexible and allows the tiles to move vertically and horizontally within the definitions and expectations of specific structures. All the tiles have the conductive sub-layer at the same height, thus allowing maximum contact and efficiency of energy transfer. The use of magnets as a form of attachment also allows vibrational interference not to weaken the structure and allows a controlled amount of movement laterally when mounted on a flexible resin surface.

Typically, a plurality of the apparatuses of the invention are used in conjunction with each other in a flexible array of battery cells, solar tiles and energy management cells. The apparatuses may be used anywhere that has a requirement for power generation and storage. One potential location is on a marine vessel, such as a boat or ship. The apparatuses may be installed on the deck of the vessel, or on the side of the vessel, or on a cabin roof, or anywhere else which will be exposed to the necessary elements which might be considered suitable.

If the second layer comprises a solar panel, then any location where the apparatus would be exposed to the sun would be suitable for it to be located; similarly, any device capable of harnessing water for hydrogen generation would ideally be located where it can be exposed to water.

If the second layer comprises a hydrogen fuel cell, then the apparatus is more typically located on the side of the vessel, and more typically near to the water line and a source of flowing water. In the hydrogen fuel cell, a membrane splits the water into hydrogen and oxygen atoms, releasing the oxygen and providing storage for hydrogen directly into sealed areas of a fuel cell or internal fuel cells. The inclusion of ballast areas which contain quantities of water within a vessel may be considered for small quantities of hydropower generation and localized storage. All arrays can be reconfigured or re-positioned as art of a changing profile or changing energy requirement in any structure. For example, the introduction of new electrical equipment may require more localized power.

Overall, the present invention allows power to be generated, stored and used locally in an efficient and effective battery-based power grid apparatus that can be bespoke to specific requirements. It also comprises a facility to monitor amounts of energy that are being stored in and/or used by the apparatus, which can be carried out remotely by, for example, an app. One way the invention can be bespoke is through the use of removable tiles or panels comprising the apparatus of the invention. The tiles or panels can be changed and updated to maximise energy capture depending on the specific needs of a user, and the specific structure they are to be used on, or the specific with power use or storage requirements. This system also allows for future enhancements in technology to be quickly introduced and integrated into the existing structure. It is important to note that the conductive sub-layer in the third layer will be an effective structural base for second and first layers above it. The attachment of the deck structure may be two-fold with the initial third layer being bonded or fixed and the second layer through the housing also being bonded or fixed on top of this. When an adhesive is used, the tile part can be released and therefore repositioned with a suitable solvent and re-fixed by the same kind of adhesive. The housing, should it become damaged, can be repaired by epoxy resin and colour matched to minimize any loss of consistency in finish and performance.

The third layer may also provide an integrated network of sensors that can provide structural information regarding the integrity of the structure they are attached to. This can be operated and powered via the energy layer (second layer). The one or more sensors may be used as ongoing recording of data in an autonomous ship for example, or, be part of a routine inspection during a vessel's lifecycle. The one or more sensors may be directly connected to the surface or deck to which the apparatus is fixed, via an opening in the lower sub-layer of the third layer which is positioned directly below the one or more sensors on the conductive sub-layer. The type of sensors may be selected for the appropriate use of the software system attached to the system and the level of data required to be recorded. The one or more sensors will be suitable for harsh environment operation and may contain graphene and silicon materials.

According to another embodiment of the invention, there is provided a marine vessel comprising one or more apparatuses as defined hereinabove.

According to another embodiment of the invention, there is provided a use of one or more apparatuses as defined hereinabove in the generation and storage of power, particularly electrical power.

The use of isolated arrays can be referred to as clusters. These clusters can operate in different ways either with capacitors to upscale energy for instant deck-based use, or they can be set up for storage where they can be used for hotel load power, this is power required after the available natural light is no longer able to provide ongoing facility for overnight luxury and the battery energy must provide this energy through the discharge of the batteries.

The energy from solar power will be generated as with all PV solar as DC current. It will be stored and used in this arrangement. Levels of solar energy may be able to provide propulsion energy feeding directly fed DC power into the new build generation of ship design that is built around electrical systems using DC only supply, which to power heavier equipment is more efficient. The maximum deck operating power level of the deck system will be 48V and minimum of 12V in most arrangements; this is designed around the transfer of technology from other transport sectors into marine where management and autonomous navigation systems will require a separate and reliable back up energy system should their systems be broken.

The present invention also provides a method of generating and storing power comprising employing one or more apparatuses apparatus as defined hereinabove.

The invention will now be described further by way of example with reference to the following figures which are intended to be illustrative only and in no way limiting upon the scope of the invention.

Figure 1:
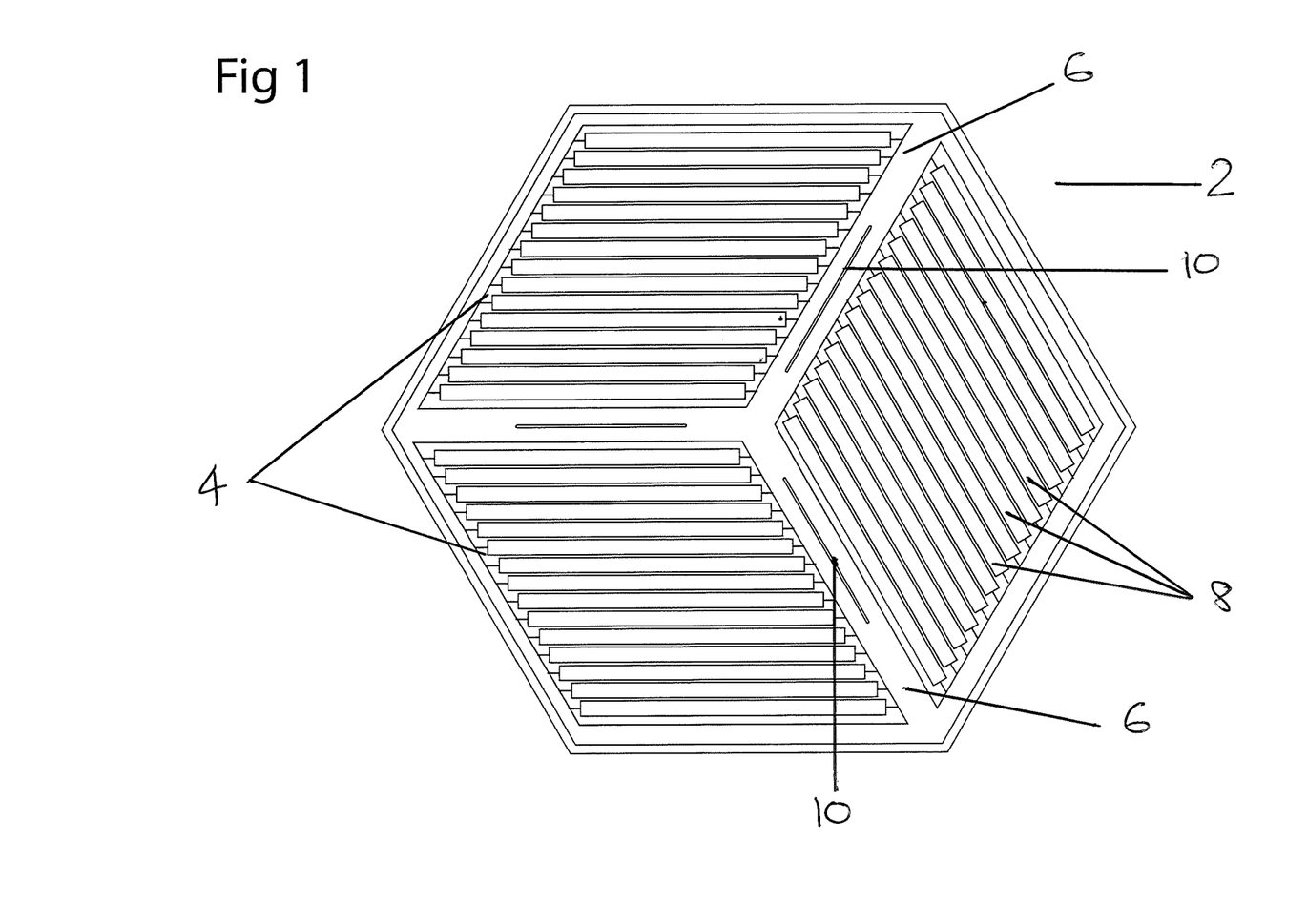
FIG. 1 depicts a top view looking down showing a typical PV and LED layout in the invention.

In FIG. 1, a hexagonal-shaped second layer 2 of the apparatus of the invention is shown. The second layer 2 is divided into three sections 4, each with a spacing or pathway 6 between them. In each section 4 is a plurality of photovoltaic cells 8, arranged in each section in a parallel arrangement. Located along each spacing or pathway 6 are one or more LEDs 10, for the provision of controlled illumination if required.

In FIG. 2, the interrelationship of the second and third layers of apparatus of one embodiment of the invention can be seen. This exploded view shows the second layer 2 positioned above segments of the (electrically non-conductive) upper sub-layer 14 of the third layer 16. The second layer 2 has a hexagonal-shaped magnet 18 positioned at the centre of its lower surface. The segments of the upper sub-layer 14 of the third layer 16 each have a smaller magnet 20 located at alternating corners of their segments, such that when three of the segments of the upper sub-layer 14 are positioned together, the shape of the magnets 20 forms a hexagon-shaped magnet 22, which is the same size as that of the magnet 18 on the lower surface of the second layer 2.

The second layer 2 connects with the segments of the upper sub-layer 14 of the third layer 16 via the hexagon-shaped magnet 22. This pattern of interaction between the second layer 2 and the third layer 16 is repeated across the top of the third layer 16.

Below the upper sub-layer 14 of the third layer 16 is the conductive sub-layer 24, and below that is the (electrically non-conductive) lower sub-layer 26. The conductive sub-layer 24 has (shown as hexagon-shaped) sensors 28 located on it upper surface 30. The lower sub-layer 26 has correspondingly-shaped openings 32 created therein; the sensors 28 being positioned so that they lie over the openings 32 in order to be able to connect directly to a surface lying beneath the lower sub-layer 26.

Figure 3:
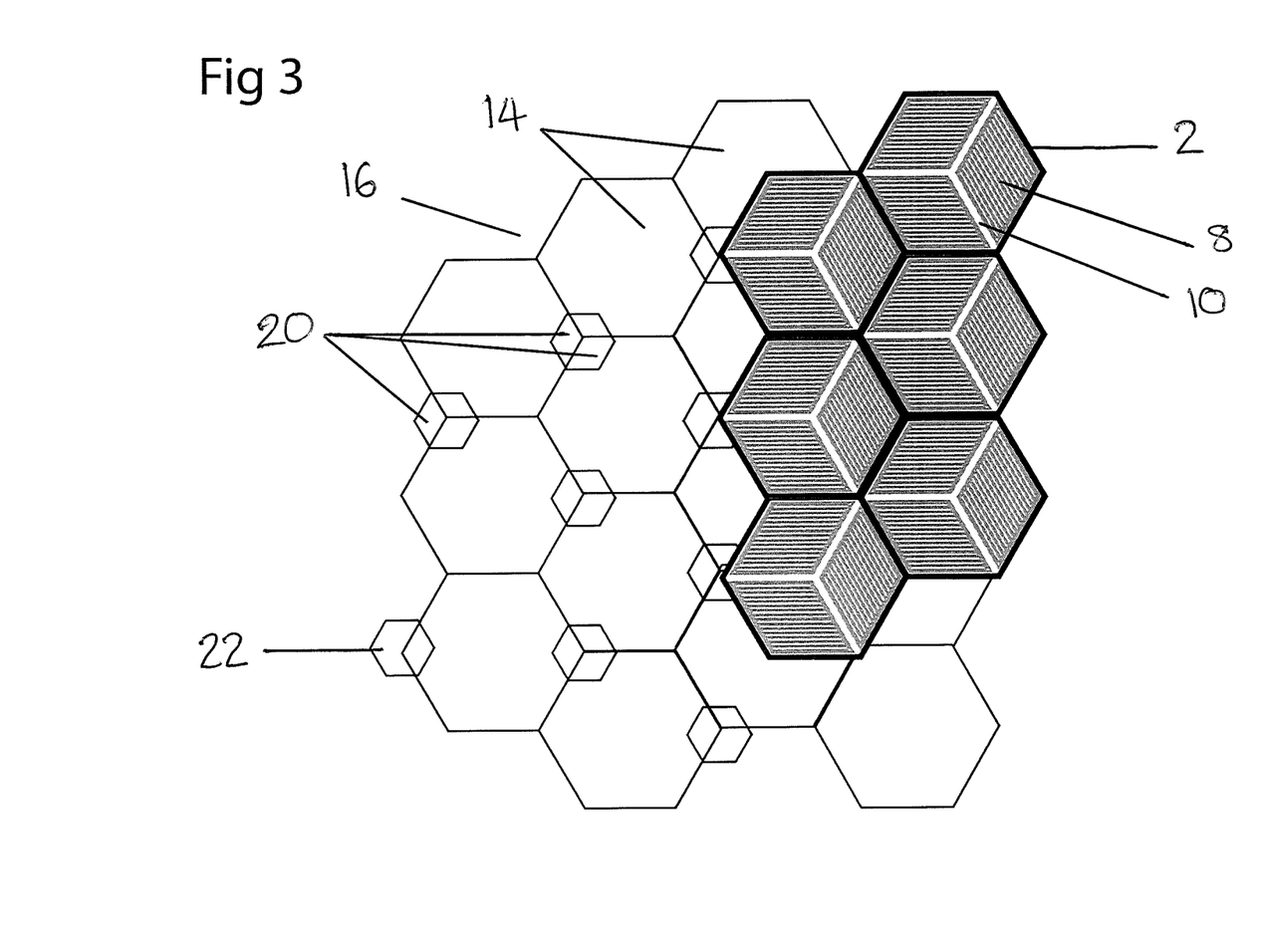
FIG. 3 depicts an overhead pictorial view of a plurality of segments of the second layer positioned over segments of the upper sub-layer of the third layer in an offset arrangement.

In FIG. 3, an overhead perspective of the interrelationship between the second layer 2, with its PV cells 8 and LEDs 10 positioned thereon, and the upper sub-layer 14 of the third layer 16 can be seen. As was also shown in FIG. 2, the segments of the upper sub-layer 14 of the third layer 16 each have a magnet 20 located at alternating corners of their segments, such that when three of the segments are positioned together, the shape of the magnets 20 forms a hexagon-shaped magnet 22. The second layers 2 are positioned in an offset manner relative to the segments of the upper sub-layer 14 of the third layer 16, to ensure that the magnet 18 (not shown) positioned at the centre of its lower surface engages completely with the magnet 22 formed on the third layer 16.

Figure 4:
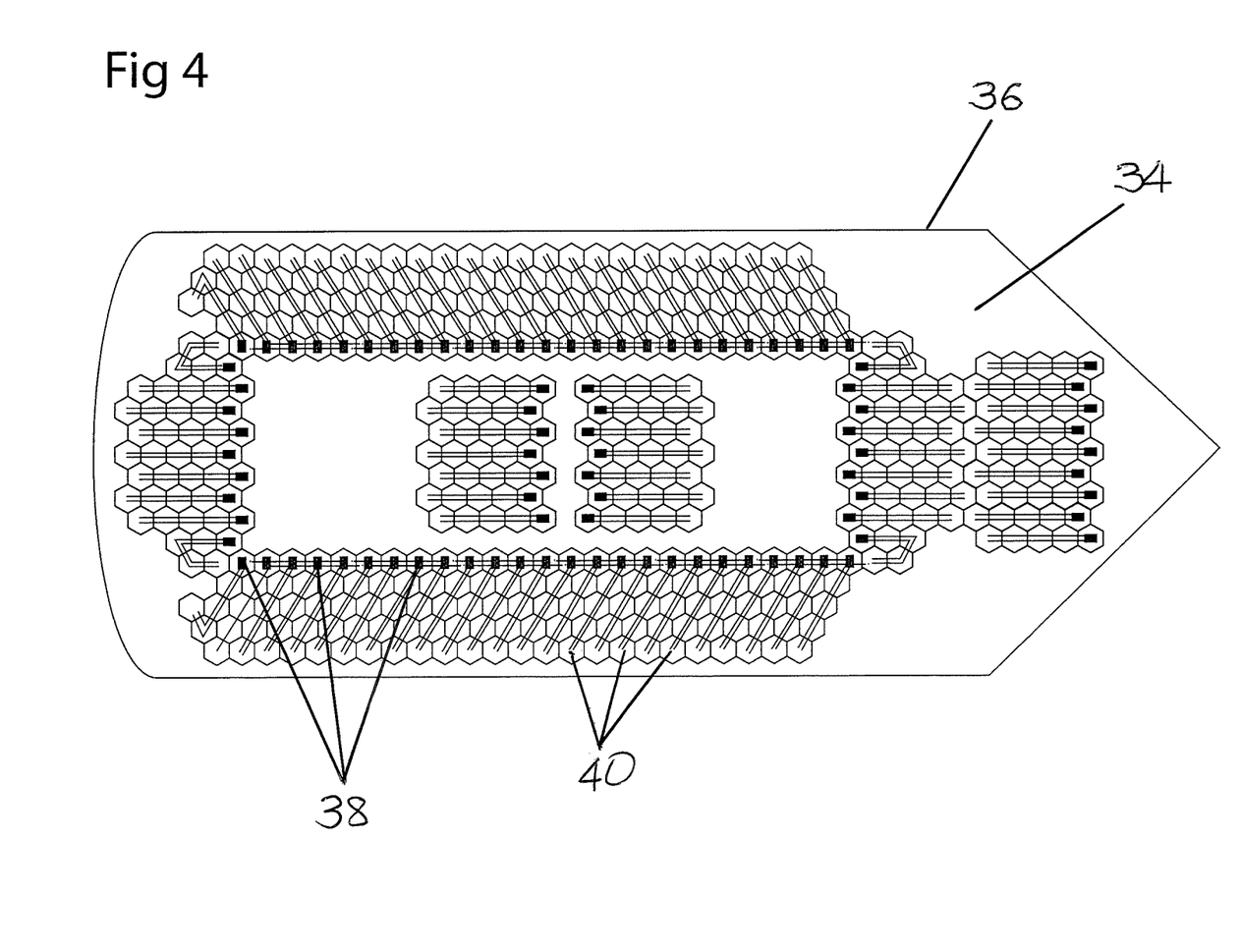
FIG. 4 depicts overhead technical plan view of an example of a completed boat installation comprising a plurality of apparatuses of the invention in an interconnected array.

In FIG. 4, a deck 34 of a boat or ship 36, upon which the apparatus of the invention is positioned. There are a plurality of battery tiles 38, which are each in electrical communication with energy generating units provided by four second layers of the apparatus of the invention 40. There will also be a smaller number of energy management units or tiles (not shown in this Figure), each of which controls the energy stored in the batteries. For the number of battery tiles 38 shown in FIG. 4, somewhere between 4 to 8 energy management units or tiles would be required. This is one example of a layout and is not representational of every layout.

It is of course to be understood that the present invention is not intended to be restricted to the foregoing examples which are described by way of example only.

The invention claimed is:

1. An apparatus for the capture and storage of power, the apparatus comprising:
   i) a first layer acting as a protective layer, and being provided with non-slip characteristics;
   ii) a second layer comprising a device that is able to generate power from a natural energy source, wherein the first layer simultaneously allows the second layer to be exposed to the natural energy source, the device comprising one or more photovoltaic cells which are manufactured via perovskite crystallization, wherein there is a light guide or optic concentrator device on the one or more photovoltaic cells, and wherein the second layer comprises quantum dots embedded within the second layer; and
   iii) a third layer comprising an energy distribution system, wherein the third layer comprises three sub-layers therein, and wherein the sub-layers include an electrically conductive sub-layer sandwiched between an upper sub-layer and a lower sub-layer, both the upper and the lower sub-layers being substantially electrically non-conductive; and wherein the electrically conductive sub-layer provides flexibility and movement tolerance and comprises a composite alloy material comprising one or more of a rare earth magnetic metal, copper, copper oxide, graphene, graphene oxide, cobalt, and nickel;
   wherein the first, second and third layers are all present as part of individual tiles, which are removable.

2. The apparatus according to claim 1, wherein the second layer comprises a plurality of photovoltaic cells, or a hydrogen fuel cell.

3. The apparatus according to claim 2, wherein the plurality of photovoltaic cells is located on a surface of the second layer that is proximal to the first layer.

4. The apparatus according to claim 2, wherein the plurality of photovoltaic cells is located on one or more sides of the second layer.

5. The apparatus according to claim 1, wherein the apparatus comprises a housing, the housing comprising a resin material containing an amount of one or more of graphene oxide, boron nitride, fire retardant additives, carbon black and/or graphite.

6. The apparatus according to claim 1, wherein the second layer comprises a dye material.

7. The apparatus according to claim 1, wherein the conductive sub-layer comprises a flexible conductive mesh structure.

8. The apparatus according to claim 1, wherein the conductive sub-layer comprises one or more sensors located thereon.

9. The apparatus according to claim 1, wherein the second layer and third layer are connected together by one or more magnets.

10. The apparatus according to claim 9, wherein the second layer comprises one or more magnets on a lower surface thereof, and the upper sub-layer of the third layer has a magnet positioned at one or more corners thereof.

11. The apparatus according to claim 1, wherein the first, second and third layers of the apparatus together form a tile or panel.

12. The apparatus according to claim 1, wherein the first and second layers of the apparatus together form a tile or panel, which is then connected to the third layer.

13. The apparatus according to claim 1, wherein the conductive sub-layer provides an energy distribution system to distribute electricity generated by the apparatus across a plurality of interconnected apparatuses.

14. An array comprising a plurality of apparatuses according to claim 1 interconnected with each other.

15. The array according to claim 14, wherein any two or more apparatuses are connected to each other using one or more magnetic connectors, or a bonding or connecting conductive material.

16. The array according to claim 14, wherein electrical power is stored in a battery located within a battery cell.

17. The array according to claim 14, wherein the array is operated in conjunction with one or more energy management cells, the one or more energy management cells each comprising a printed circuit board, which controls a flow of electricity across the array.

18. The array according to claim 17, wherein each energy management cell controls the flow of electricity across a minimum cluster of four or more apparatuses.

19. A marine vessel comprising the apparatus according to claim 1.

20. A method of generating and storing power comprising a step of employing the apparatus of claim 1.

21. The apparatus according to claim 1, wherein the non-slip characteristics of the first layer are provided via raised protrusions thereon.

22. The apparatus according to claim 21, wherein the raised protrusions have a random pattern.

23. The apparatus according to claim 21, wherein the raised protrusions have a repeated pattern.

24. The apparatus according to claim 1, wherein the non-slip characteristics of the first layer are provided via pieces of a particulate material embedded therein.

* * * * *